United States Patent
Dent

(10) Patent No.: US 6,347,125 B1
(45) Date of Patent: Feb. 12, 2002

(54) REDUCED COMPLEXITY DEMODULATOR FOR MULTI-BIT SYMBOLS

(75) Inventor: Paul W. Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/228,160

(22) Filed: Jan. 11, 1999

(51) Int. Cl.[7] .............................. H03D 1/00; H04L 27/06
(52) U.S. Cl. ...................................................... 375/341
(58) Field of Search ................................ 375/316, 340, 375/341, 346, 347, 229, 230, 232, 342; 371/43.6, 43.7, 43.8; 714/794, 795

(56) References Cited

U.S. PATENT DOCUMENTS

| | | | |
|---|---|---|---|
| 4,484,338 A | 11/1984 | Clark et al. | |
| 4,885,757 A | * 12/1989 | Provence | 375/343 |
| 5,031,195 A | 7/1991 | Chevillat et al. | |
| 5,251,237 A | * 10/1993 | Baier | 375/346 |
| 5,307,374 A | 4/1994 | Baier | |
| 5,331,666 A | 7/1994 | Dent | |
| 5,335,250 A | 8/1994 | Dent et al. | |
| 5,432,821 A | * 7/1995 | Polydoros et al. | 375/340 |
| 5,467,374 A | 11/1995 | Chennakeshu et al. | |
| 5,557,645 A | 9/1996 | Dent | |
| 5,577,053 A | 11/1996 | Dent | |
| 5,577,068 A | 11/1996 | Bottomley et al. | |
| 5,862,156 A | * 1/1999 | Huszar et al. | 714/795 |
| 6,134,277 A | * 10/2000 | Shah | 375/341 |

FOREIGN PATENT DOCUMENTS

| | | | |
|---|---|---|---|
| EP | 0332290 | 9/1989 | H04L/25/30 |
| EP | 0632623 | 1/1995 | H04L/25/03 |

OTHER PUBLICATIONS

Eyuboglu, V.M., et al., "Reduced–State Sequence Estimation with Set Partitioning and Decision Feedback", IEEE Transactions on Communications, vol. 36, No. 1, Jan. 1988.*

Eyuboglu, V.M., et al., "Reduced–State Sequence Estimation with Set Partitioning and Decision Feedback", *Telecommunications Conference and Exhibition (Globecom)*, XP000794892, Dec. 1986.

* cited by examiner

Primary Examiner—Stephen Chin
Assistant Examiner—Lenny Jiang
(74) Attorney, Agent, or Firm—Coats & Bennett, P.L.L.C.

(57) ABSTRACT

A decoder also includes a channel estimator to estimate coefficients describing a channel through which the signal has propagated, a signal predictor that combines the channel estimates with corresponding samples of the signal to obtain a metric, and a metric accumulator to accumulate the metrics for hypothesized symbol sequences to determine the likelihood indications. The hypothesized symbol sequences include partial symbols that select a subgroup of the symbol alphabet. This allows those parts of a symbol that are most important for predicting signal samples to be retained in a hypothesized state while the remaining parts can pass to a path history memory, thereby reducing the number of possible states that must be considered.

15 Claims, 10 Drawing Sheets

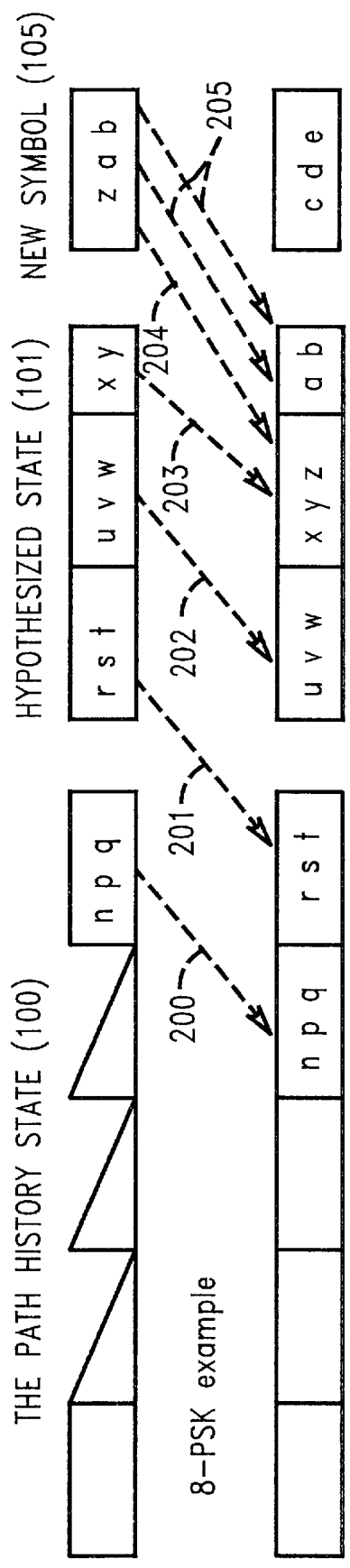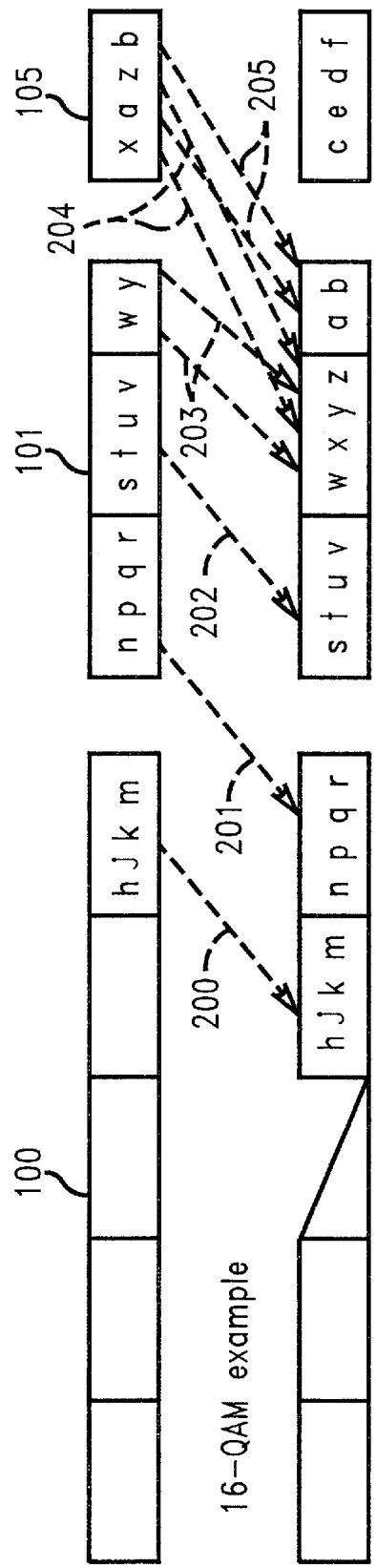
FIG. 11
FIG. 12

REDUCED COMPLEXITY DEMODULATOR FOR MULTI-BIT SYMBOLS

FIELD OF THE INVENTION

The invention relates to the field of wireless communication, and, more specifically, to demodulating and decoding information symbols from a symbol-modulated radio signal that has suffered inter-symbol interference.

BACKGROUND OF THE INVENTION

Signals in a wireless communications system are subject to a number of phenomena that degrade signal quality. Each signal is reflected from many different man-made and natural objects. The receiver thus receives a number of signals delayed by one or more signal periods (called "multipath"), as each reflected signal is received. If the period of delay is more than the time required to transmit one symbol (inter-symbol interference), then the decoder in the receiver may not be able to decode the symbol, causing poor sound (or data) quality to the user. Many different algorithms are used at the receiver to attempt to compensate for such effects. One such algorithm is the Maximum Likelihood Sequence Estimator (MLSE) or "Viterbi" algorithm.

Viterbi decoding of an information symbol modulated signal comprises sampling the signal to obtain samples that each depend on a limited number (L) of sequential information symbols, and then hypothesizing all possible $M^L$ sequences of the L sequential symbols that affect a given signal sample. The hypothesized sequences are used to predict the sample value, the sample value is compared to the received signal and the prediction error is accumulated in a metric for each sequence of symbols. When the sequence is advanced one symbol to predict the next sample, the oldest symbol drops out of the window of L consecutive symbols on which the next prediction sample depends and a tentative decision for that symbol is made. A tentative symbol decision is associated with each of the remaining $M^L$ sequences which builds a "path history" associated with each remaining sequence. It is known that the tentative decisions may be made before the next symbol is hypothesized so that the number of symbols hypothesized reduces to L−1 symbols after each iteration, and the number of remembered path histories with associated metrics is thus $M^{L-1}$.

Prior art descriptions of MLSE (Viterbi) algorithms are contained in, for example, U.S. Pat. No. 5,331,666 to Applicant entitled "Adaptive Maximum Likelihood Demodulator;" U.S. Pat. No. 5,335,250 to Applicant entitled "Method and Apparatus for Bidirectional Demodulation of Digitally Modulated Signals;" U.S. Pat. No. 5,467,374 to Chennakeshu et al. entitled "Low Complexity Adaptive Equalizer for U.S. Digital Cellular Receivers;" U.S. Pat. No. 5,577,068 to Dent and Bottomley entitled "Generalized Diect Update Viterbi Equalizer;" U.S. Pat. No. 5,557,645 to Applicant entitled "Channel-Independent Equalizer Device;" U.S. Pat. No. 5,577,053 to Applicant entitled "Method and Apparatus for Decoder Optimization," all of which are incorporated herein by reference. Further descriptions are found in U.S. patent Ser. No. 08/218,236 (Dent and Croft, filed Mar. 28, 1994); Ser. No. 08/305,727 (Dent, filed Sep. 14, 1994); and Ser. No. 08/393,809 (Dent, filed Feb. 24, 1995), all of which are incorporated herein by reference.

In all of the above prior art, decoded symbols are entirely located in the set of sequences being postulated, in the set of path histories associated thereto, have been already extracted from the decoder or have not yet been hypothesized by the decoder at all. The prior art has thus addressed the need to limit decoder complexity by limiting the number of retained sequences through various means of limiting the number of sequential symbols that have to be jointly hypothesized. This can include just omitting one or more symbols and tolerating a loss of performance.

Another prior art method utilizes symbols that have already passed from the hypothesis stage to the path history on which signal samples depend to predict the next signal sample. This is disclosed in U.S. Pat. No. 5,307,374 to Baier, which is incorporated herein by reference. Thus, the number of sequential symbols retained in the hypothesis stage is reduced from L−1 by the number of symbols in the path history that are used for signal prediction. In this algorithm, known as "per-survivor processing," not all combinations of symbols that have passed into path history are tested, which results in a small loss of performance. However, in common with the previously discussed prior art, symbols are either entirely in the path history or not.

The number of retained states may also be less than a power of the alphabet size when using another prior art method called the "M" algorithm. The M algorithm reduces the number of retained states by discarding those that have low likelihood metrics. Only the best M states are retained. The best M states, however, are not guaranteed to contain all values of the most recently hypothesized symbol. Having all values of the most recently hypothesized symbol is desirable in equalizers to demodulate signals that have propagated through multiple paths of differing delay, and wherein the path containing the greatest energy is not the path of shortest delay.

The M algorithm is also described in connection with the processing of partial symbols, in U.S. Pat. No. 4,484,338 to Clark. Clark uses the M algorithm to limit the number of retained hypotheses to a desired number M. Each retained hypothesis in Clark comprises, however, a number "n" of complete symbols, not partial symbols. Clark uses the concept of partial symbols only to reduce the effort in expanding the number of retained hypotheses from M to M times the alphabet size by postulating a new symbol, down-selecting to the best M again, performing the expansion in two smaller expansion stages, and down-selecting to M again after each expansion stage. However, the technique of Clark involves premature selection after the first stage of expansion of values of the just-hypothesized partial symbol. This premature selection can lead to degraded performance because not all values of the partial symbol or alphabetic subgroup are guaranteed to be retained for further evaluation. The above '338 patent to Clark, moreover, only discloses the possibility of dividing symbols into partial symbols when a whole symbol can be reconstructed from the linear, weighted sum of the partial symbols.

The current invention solves one or more of the deficiencies of the prior art.

SUMMARY OF THE INVENTION

The current invention describes how symbols may be allowed to straddle the region containing hypothesized symbols and the path history region, so that symbols exist partially in both states. This allows those parts of the symbol that are most important for predicting signal samples to be retained in the hypothesized state while the remaining parts can pass to the path history. This novel approach confers the advantage that, when using symbol alphabets larger than the binary alphabet, the decoder complexity can be tailored to values lying between two powers of the alphabet size, thereby allowing decoders of a maximum practical complexity (and thus performance) to be used. The prior art teaches decoders of only much less than the maximum practical complexity and performance or alternatively greater than the maximum practical complexity, i.e., impractical decoders.

In accordance with one aspect of this invention, a method is disclosed for processing samples of a signal that has propagated from a transmitter to a receiver via multiple propagation paths in order to decode information symbols belonging to an alphabet of symbols. The method includes the step of hypothesizing symbol sequences having symbols from the alphabet of symbols and partial symbols, wherein the partial symbols identify sub-groups of symbols from the alphabet. The method further includes predicting an expected value of the signal samples for each of the hypothesized sequences and comparing actual values of the signal samples with the predicted values in order to determine a likelihood value for each of the sequences. The method further includes storing hypothesized sequences including whole symbols and partial symbols in associated with the likelihood values and selecting symbol sequences having the greatest of the determined likelihood values to be the decoded information symbols. Each of the decided symbols belongs to one of the sub-groups of symbols identified by the hypothesized partial symbols.

In accordance with another aspect of this invention, a decoder is disclosed that decodes a signal modulated with information symbols belonging to an alphabet of symbols. The decoder comprises a maximum likelihood sequence estimator that hypothesizes alphabetic sub-groups containing the information symbols, to hypothesize symbols within the alphabet and to determine a sequence of the information symbols having a highest likelihood indication. The decoder also includes a channel estimator to estimate coefficients describing a channel through which the signal has propagated, a signal predictor that combines the channel estimates with corresponding samples of the signal to obtain a metric, and a metric accumulator to accumulate the metrics for hypothesized symbol sequences to determine the likelihood indications.

BRIEF DESCRIPTION OF THE DRAWINGS

A more complete understanding of the invention may be obtained from a consideration of the following description in conjunction with the drawings, in which:

FIG. 11 illustrates shifting bits of symbols through the decoder stages for 8-PSK decoding; and FIG. 12 illustrates shifting bits of symbols through the decoder stages for 16QAM decoding.

DETAILED DESCRIPTION

Figure 1:
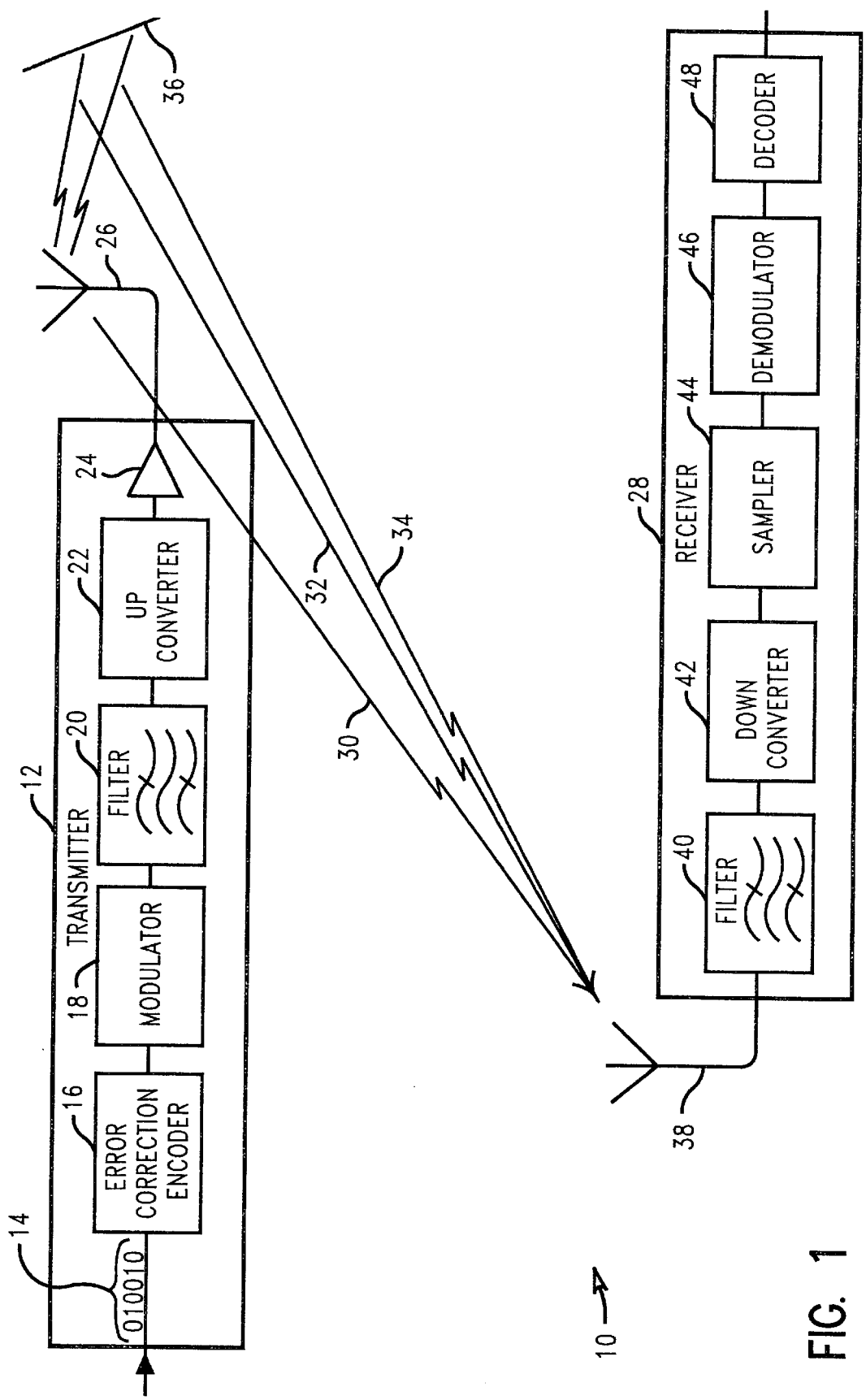
FIG. 1 is a block diagram of a typical wireless communication system transmitter and receiver.

In the wireless communication system 10 of FIG. 1, a transmitter 12 transmits information bits 14 by first grouping the bits to form information symbols in error correction encoder 16 which may encompass interleaving. Error correction encoder 16 optionally adds error detection and correction information to the information bits 14. Each symbol from error correction encoder 16 is delivered to modulator 18 and is encoded by mapping it to a unique constellation point in the complex plane containing all possible radio signal vector values. The sequence of complex constellation points (corresponding to a sequence of information bit groups to be transmitted) is filtered in filter 20 and upconverted in converter 22 to the transmission frequency. The signal is then amplified in amplifier 24 to a transmit power level for transmission from antenna 26.

A receiver 28 receives multiple images 30, 32 and 34 of the transmitted signal 30, 32 and 34 after it has propagated through a dispersive medium (including, for example, reflecting from a reflective surface 36), which results in inter-symbol interference. The receiver 28 receives the signals at antenna 38, filters the signals in filter 40, and down-converts the signal in converter 42. The receiver 28 then samples the received signal in a sampler 44 (which may be an analog to digital converter) to produce a sequence of received complex vector values including noise and inter-symbol interference (ISI) due to transmit filtering, the dispersive medium, and receiver filtering. Each complex vector value is therefore the weighted sum of several adjacent ones of the complex symbol values transmitted. The weighting factors that describe the ISI, known as channel coefficients, are determined from the received signal, for example, by correlating with known symbols included in the transmission. The signal is then demodulated in demodulator 46, as will be described further below, and decoded in decoder 48.

A known method of decoding the above received sample values uses maximum likelihood sequence estimation (MLSE). MLSE hypothesizes sequences of symbol values and combines them using the channel coefficients as weighting factors to attempt to predict the received samples. A cumulative metric is computed for each hypothesized sequence as the sum of the squares of the errors between predicted and actual signal samples, and the sequence giving the lowest error is retained as the best decoded symbol sequence. However, when the number of symbols M in the symbol alphabet is large (e.g., 16 in the case of 16 quadrature amplitude modulated (QAM) where symbols represent 4-bit groups) and the number of symbols L combined by ISI is also large (e.g., 5), then the number of sequences that must be hypothesized at the same instant is $M^{L-1}$ (e.g., $16^4 = 65536$), which requires an excessive amount of decoder computation. This problem is alleviated by this invention, which hypothesizes only enough bits of the symbol necessary to determine the approximate region in which its corresponding complex constellation point will lie. More bits, e.g., all bits, are hypothesized for symbols that are multiplied by the weighting factors of largest magnitude during signal prediction and fewer bits (e.g., 3, 2, 1 or 0) are hypothesized for symbols that are multiplied by the weighting factors of smaller magnitude.

Thus, the number of possibilities that have to be hypothesized is reduced from $M^{L-1}$ to a lower number by at least a factor of two and in a preferred implementation by a power of two. The hypothesized bits, being an incomplete description of a symbol, represent partial symbols and the hypothesized partial symbols are stored in the memory of the MLSE.

The reduction in complexity is greatest when the first and/or last symbols in a group of adjacent symbols are associated with smaller channel coefficients. The invention seeks to ensure that this is the case by using a pre-filtering operation to change the ISI profile to be of the preferred form, following which the inventive reduced complexity decoder may be used.

In a generalization of the invention, an alphabet of symbols is divided into a first number of groups each containing a second number of symbols. A Maximum Likelihood Sequence Estimation (MLSE) algorithm is employed to process received signals to decode symbols by hypothesizing all possible sequences of a third number of consecutive symbols.

According to one aspect of the invention, the first or last symbols of each possible sequence, or both, are defined only by the group they are in, thus reducing the number of possible sequences to be hypothesized by a factor equal to the number of symbols in each group or a power thereof.

In yet another implementation of the invention, an MSLE decoder for symbols including per-survivor processing is used. In per-survivor processing, each hypothesized symbol sequence has associated with it a path history of already partially decoded symbols. In the prior art, partially decoded symbols in the path history are whole symbols, as are symbols that are still only hypothesized symbols. According to this aspect of the invention, symbols in the recent path history may be replaced by a sub-group indicator indicating a sub-group within the alphabet of symbols in which the symbol is most likely to be located. A corresponding indication of the symbol within the subgroup that remains an unresolved question for the decoder is retained in the sequence of hypotheses yet to be resolved. Thus, the decoder narrows down a symbol decision to a subgroup before finally resolving to an individual symbol. This reduces the number of hypotheses that have to be tested by a factor equal to the number of subgroups or a power thereof. A variant of this inventive algorithm comprises dynamically dividing the symbol alphabet into different subgroups corresponding to sub-classifications of the symbol that are more likely to be correct. The symbols within the subgroup correspond to sub-classifications that are as yet more uncertain. The dynamic subdivision is controlled by a comparison of likelihood values associated with the hypothesized sequences.

Figure 2:
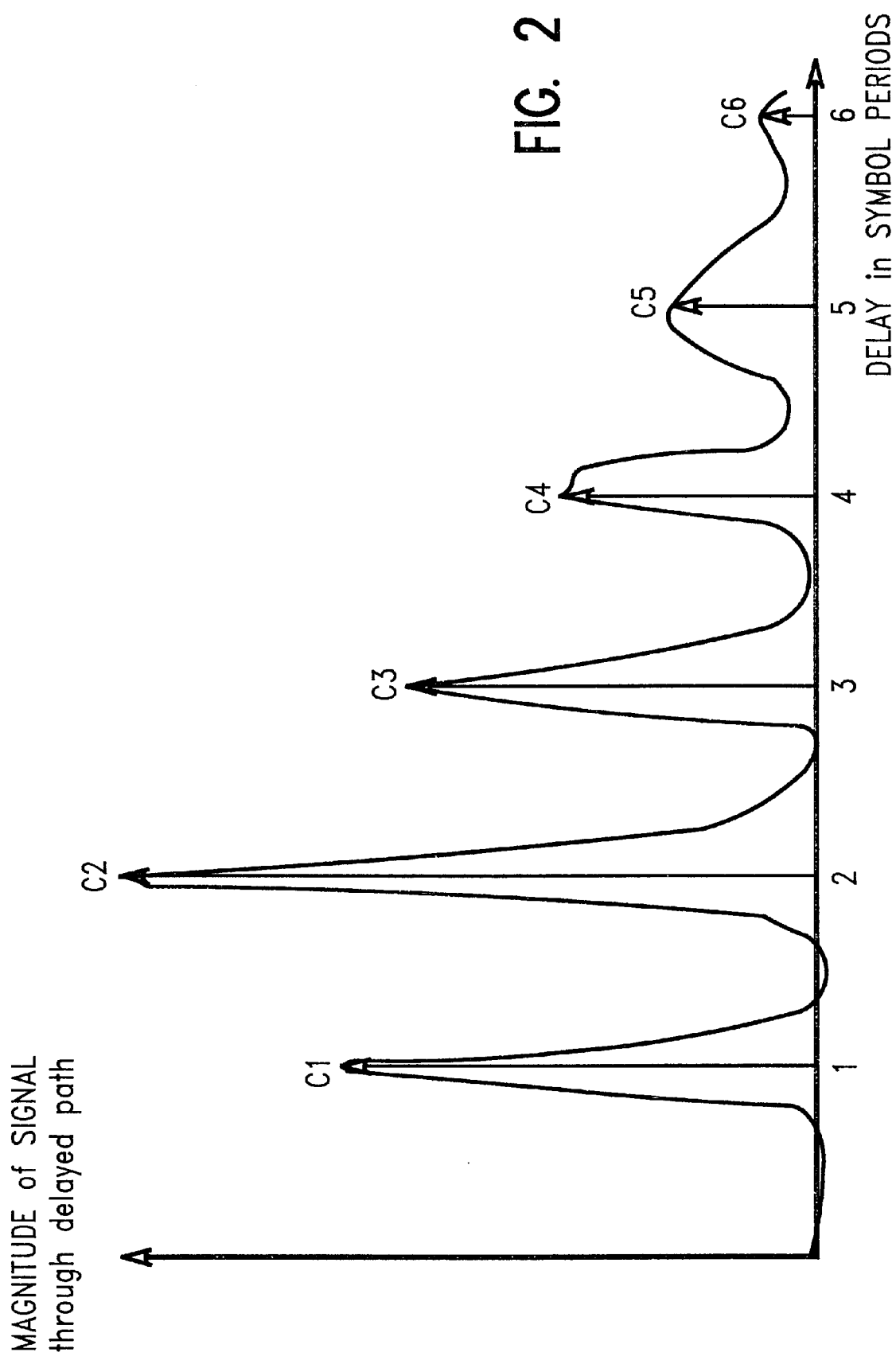
FIG. 2 illustrates a typical multipath signal propagation delay profile.

FIG. 2 illustrates the relative magnitude of differently delayed paths by which a signal can reach a receiver from a transmitter. The illustrated paths have delays around multiples of the symbol period, although this does not necessarily occur in real situations. Nevertheless, the signal through any real path is exactly the same as the signal that would have been received through paths of delays equal to integer multiples of the symbol period. In other words, a set of real paths having non-integral symbol periods of delay can always be replaced by a set of paths having only integral symbol periods of delay; the complex coefficients C1, C2 . . . C(L) that describe the phase and amplitude of each path merely have to be chosen correctly.

When multipath propagation comprising L paths of relative delays 0,1,2 . . . L−1 symbol periods exists between the transmitter and the receiver, the receiver receives delayed copies of the symbol-modulated signal such that a sample received at time "i" depends on symbols S(i), S(i−1), S(i−2) . . . S(i−L+1), i.e., on L consecutive symbols. A decoder or demodulator for signals that contain such Inter-symbol Interference (ISI) is known as an "equalizer."

One form of equalizer, known as a Decision Feedback Equalizer (DFE), attempts to subtract the contribution of already decoded symbols S(i−1) . . . S(i−L+1) when decoding symbol S(i). However, FIG. 2 shows that the amplitude C1 of the path of lowest delay (earliest arriving signal) can be smaller than the delayed paths. Therefore, basing a decoding decision on a signal with possibly lower amplitude discards most of the signal energy and is effectively "throwing out the baby with the bathwater." Moreover, if there are errors in the earlier-decoded symbols S(i−1) . . . S(i−L+1), this will result in a higher error probability also for symbol S(i), due to subtracting an erroneously estimated contribution from the symbols in error. This problem is avoided when using Viterbi or MLSE decoding.

The Viterbi algorithm can be regarded in two different ways:

(a) A separate decoding for symbol S(i) is made for all possible decoding of the previous symbols S(i−1) . . . S(i−L+1), which each have associated likelihood values called "path metrics" or just "metrics." These likelihood values are updated by decoding S(i) so that new likelihood values are available when decoding S(i+1) and S(i) has become a "previously decoded" symbol. This view of the Viterbi algorithm is more easily related to DFE which "looks back" at already decoded symbols.

(b) The alternative view of the Viterbi algorithm is that it takes a decision on the oldest symbol, S(i−L+1), for all possible "futures" comprised of symbols S(i) . . . S(i−L+2), whose influence on the signal sample is subtracted; which one to believe will be decided later when decisions for the future symbols are taken. In this look-ahead view, the decision for symbol S(i−L+1) appears only to be based on the energy in the path delayed by L−1 symbol periods, for example on the low amplitude signal path C6 in FIG. 2.

However, the symbol decisions taken by the Viterbi algorithm are better than would be anticipated by either of the above views, which would predict error rates related only to C1 in the first case and only on C6 in the second case. In fact, the use of cumulatively updated likelihood values means that the likelihood values are affected by the choice of the symbol when it is in the position of S(i), to an extent proportional to $C1^2$, as well as when it is in the position of S(i−L+1), to an extent proportional to $C6^2$ and indeed in all the intermediate positions to an extent depending on their path amplitudes squared. The total effect of a symbol on the cumulative metric thus depends on the sum of the energy over all paths, the total energy thus contributing to helping decide the symbol value. The Viterbi MSLE algorithm thus gives a decoding performance related to the total energy received, by whatever propagation path, as long as the relative path delay is less than the L−1 symbols for which the decoder was designed.

When symbols are selected randomly from an alphabet of M possible symbols and L, symbol-spaced propagation paths are to be accounted for in the decoder, the decoder must maintain $M^{L-1}$ likelihood values or metrics for all possible sequences of L−1 symbols. Thus, the decoder complexity rises exponentially with the number of paths and also increases rapidly for larger symbol alphabets. If the oldest path, for example, is omitted from consideration and an MSLE algorithm that maintains $M^{L-2}$ metrics and path histories (usually jointly referred to as "Viterbi states") is designed, then not only is the energy in the omitted path lost, but also the signal in that path causes inter-symbol interference, thus degrading performance due to both effects. The per-survivor processing algorithm is, however, a way to prevent the ISI degradation without increasing decoder complexity back to $M^{L-1}$ states. In per-survivor processing, already decoded symbols older than S(i−L+1) that have passed to the path history may still be used to cancel the ISI from paths of relative delay greater than L symbol periods. This is similar to DFE, except that the subtraction of ISI is done on a per-state basis, as different states contain different older-symbol decisions in their path history. For this reason, per-survivor processing is sometimes known as using "DFE taps." "Taps" refers to the notion that symbols are being shunted down a tapped delay line of length L symbols and then out of the MSLE part of the delay line into the path history part of the delay line.

Figure 3:
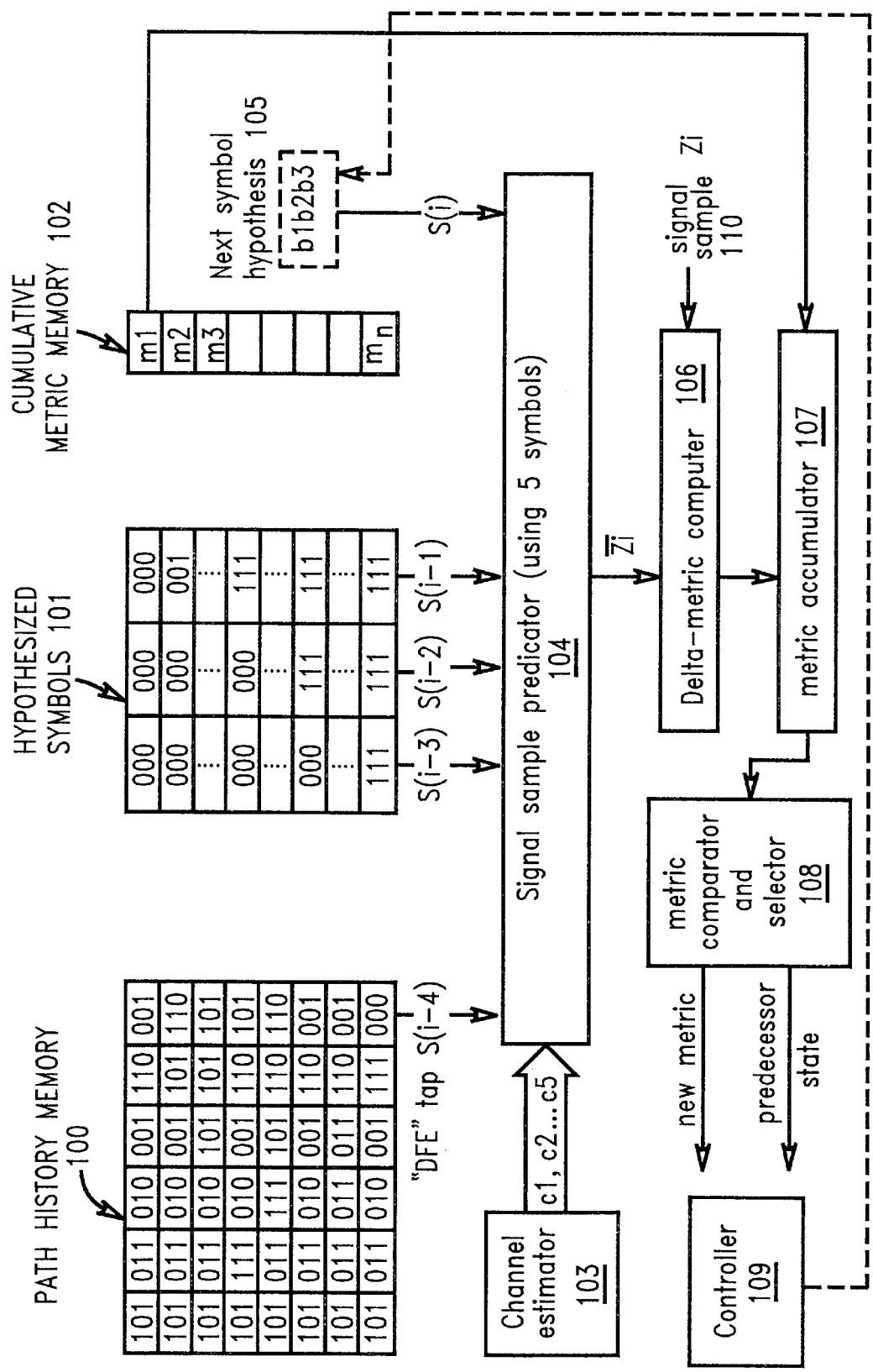
FIG. 3 illustrates the structure of the prior art "per-survivor processing" algorithm.

A prior art decoder structure having both MSLE and DFE taps is shown in FIG. 3. FIG. 3 illustrates decoding octal symbols, i.e., symbols selected from an alphabet containing 8 possible symbols, as occurs when using 8-PSK modulation.

A State Memory, comprising at least a Path History Memory 100 and Cumulative Metric Memory 102, stores already partially decided octal symbols, which are designated by a bit-triple of three binary bits each. Each path history stored in path history memory 100 has an associated metric value $m1, m2 \ldots m_n$. Each row of the state memory corresponds to one possible hypothesis for symbols S(i−1), S(i−2) and S(i−3). There are $8^3$ possible hypotheses of three octal symbols, so the number of rows is 8×8×8=512. For compactness, FIG. 3 does not show all 512 rows in the state memory, only eight exemplary rows are illustrated. The three hypothesized symbols corresponding to each row are shown in 101, but no explicit store is necessary for these, as they represent the addresses in state memory of each row.

An MLSE controller 109 generates a hypothesis 105 for the next symbol S(i) and signal sample predictor 104 combines the new hypothesis S(i) with the previous four symbols S(i−1) . . . S(i−4), three of which are still in the hypothesized state 101, where all possible combinations remain alive. The oldest symbol S(i−4) is no longer in the hypothesized state 101 but is in the path history memory 100, being already partially decided, meaning that not all combinations of S(i−4) together with the other symbols have been retained. The objective of the MSLE demodulator is to decide which values of symbols shall pass from the hypothesized state 101 into the path history memory 100 based on the likelihood-indicative metrics memory 102.

Signal sample predictor 104 combines the five successive symbols consisting of the new hypothesis S(i), a selected three previous hypotheses from 101 S(i−1), S(i−2), S(i−3) and an already decoded value S(i−4) or "DFE" tap from path history memory 100 with corresponding channel estimates C1, C2 . . . C5 provided by channel estimator 103 in order to predict the complex value of the next signal sample to be received over the multipath propagation channel.

Predictor 104 employs a model of the modulation process used at the transmitter to convert octal symbols to transmitted signal vectors, for example a look-up table containing 8 complex values, multiplies each vector by the corresponding complex weight C1 . . . C5 and adds the result to obtain the signal value Zi that would be received over the assumed five-path channel. Delta metric computer 106 compares the predicted value Zi with the actual received signal sample value Zi and computes the mismatch, which is usually the square of the modulus of the difference between them (known as a Euclidean metric). The delta metric is then added in metric accumulator 107 with the previous cumulative metric from 102 associated to the same, three-symbol hypothesis (i.e., row of state memory 100, 102) selected above, thereby obtaining a candidate value for a new row with address S(i), S(i−1), S(i−2) after S(i−3) has shifted left into the path history memory 100 at the end of a processing cycle for signal sample Zi.

Controller 109 obtains eight candidate metric values corresponding to the same values of S(i) . . . S(i−2) but different values of S(i−3). These eight candidate values are compared in metric comparator and selector 108 to determine the smallest and therefore which value of S(i−3) would be the best choice given those three fixed values of S(i) to S(i−2). That value of S(i−3) is then shifted into the path history of a new state memory row designated by those three values of S(i) to S(i−2) and the determined smallest candidate metric becomes the new cumulative metric for that row in the new state memory's metric store 102.

A practical implementation of an MSLE decoder often uses two state memories: one for the old values and one to be filled in with the new values. The memories are swapped on alternate processing cycles, in order to avoid overwriting old values prematurely before they are finished with. However, "in place" algorithms are possible providing parallel processing to perform all calculations that use old values in parallel before overwriting any old value.

Controller 109 repeats the above operation for all rows of the state memory 100, 102, (i.e., for all three-symbol selections S(i−1) . . . S(i−3)) and for all new symbol hypotheses 105 for new symbol S(i) in order to completely fill a new state memory 100, 102 with new values. One cycle of processing for signal sample Zi is now complete. At this point, decisions for S(i−3) have passed from the hypothesized state 101 to the path history memory 100 and the hypotheses corresponding to each of the 512 rows of the state memory are now hypotheses for S(i), S(i−1) and S(i−2) instead of S(i−1),S(i−2) and S(i−3), thus advancing the processing by one symbol.

The path history memory 100 of a new state contains the values of the path history of a selected predecessor state that gave a smallest candidate metric value, with a previously hypothesized symbol selection appended. This overwriting of old path histories with new path histories tends to successively narrow down the oldest symbol in the path history eventually to a single value, as indicated in the leftmost column of 100, where only the octal value "101" has survived in all rows. Whenever this happens, the oldest symbol value may be extracted as the final decision for that symbol, shortening the path history memories 100 by one symbol. Sometimes it is necessary to truncate the growth of path history memory 100 length by extracting the oldest symbol before convergence to a single unambiguous value has occurred, the best method being to choose the symbol value from the state (row) having the lowest associated cumulative metric value.

In this prior art device of FIG. 3, per-survivor processing (use of the DFE tap S(i−4)) has permitted the ISI due to a 5-symbol periods of time dispersion to be compensated, while still only using 512 states. There will be a performance loss compared to extending the number of states to 4096 by including a fourth symbol S(i−4) in the hypothesized state 101, as the price to be paid for reducing the complexity from 4096 to 512 states to be processed per signal sample. In the prior art, there was no way to use 1024 or 2048 states as a compromise, or to further reduce the complexity to 256 or 128 states, as these are not powers of 8.

Figure 4:
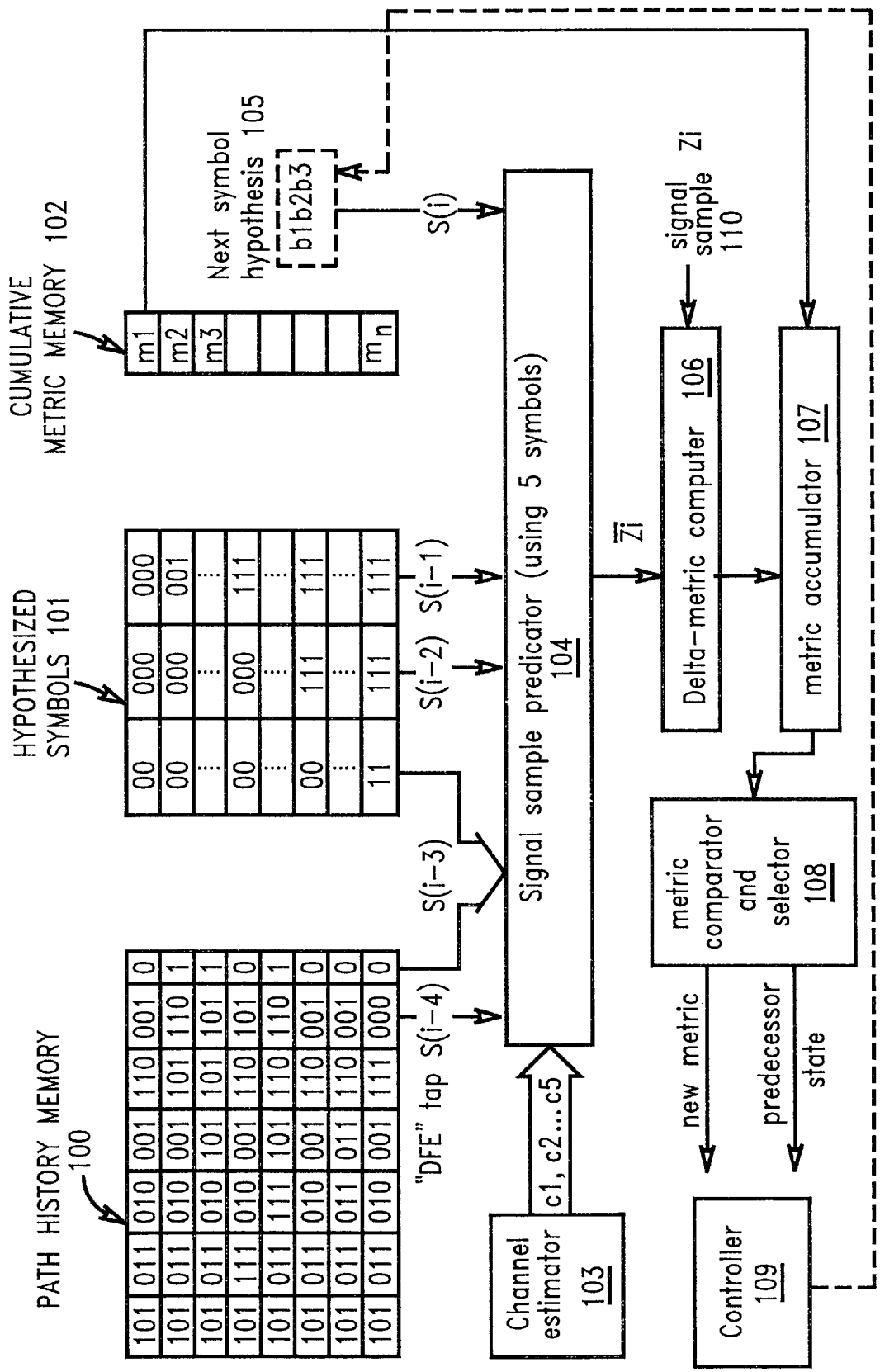
FIG. 4 illustrates the structure of an algorithm according to an exemplary embodiment of the invention.

FIG. 4 illustrates one exemplary embodiment of this invention aimed at reducing the complexity from the 512 states of FIG. 3 to 256 states. All of the elements 100 . . . 110 of the device exist as before, except that now symbol S(i–3) straddles the path history memory 100, which contains a tentative decision for one of the bits of S(i–3) and the hypothesized state 101 which contains the remaining partial-symbol bit pair of S(i–3) that are not yet decided. Thus, since an uncertainty of only four (two undecided bits) instead of eight (all three bits undecided) remains for symbol S(i–3) in FIG. 4 as compared to FIG. 3, the number of states or rows of the state memory 100,102 is reduced from 8×8×8=512 to 4×8×8=256.

Figure 5:
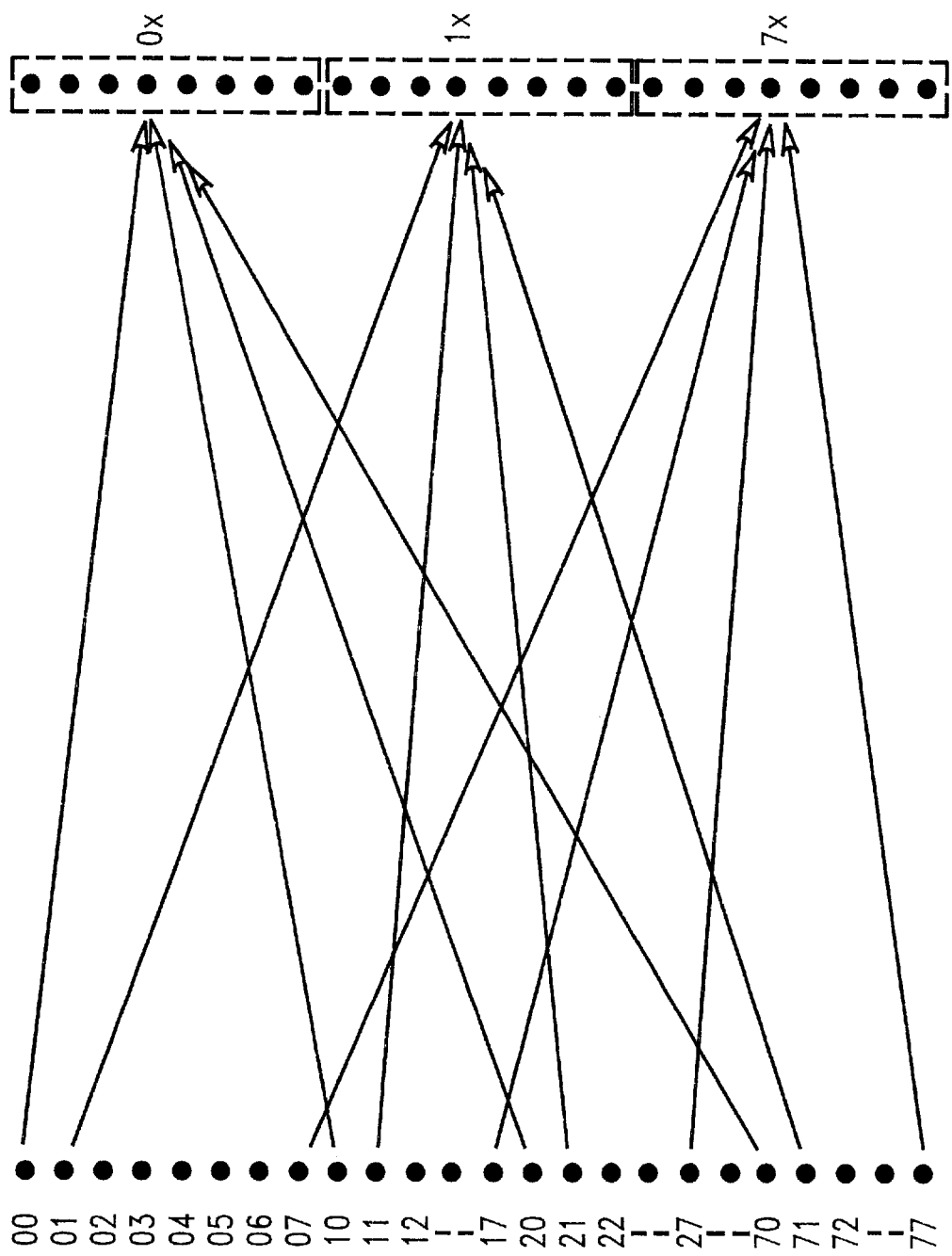
FIG. 5 illustrates the trellis diagram for the prior art decoder of FIG. 3.

In the prior art device of FIG. 3, comparator 108 selects one of 8 candidate metrics to become the new values for a new state and a set of transition rules from old states to new states was implemented, known as a "trellis." The trellis diagram for octal symbols from FIG. 3 is shown in FIG. 5. For simplicity, only a 64-state trellis is used, and only part of the trellis is shown.

The trellis diagram shows old states, which are numbered now with two octal digits ranging from 0 to 7, i.e., the 64 states are numbered:

00, 01, 02 . . . 07; 10, 11, 12 . . . 17; 20, 21, 22 . . . 27; 70, 71, 72, 73 . . . 77;

transitioning to new states also numbered:

00 . . . 77.

The candidate predecessor states for a new state 0x, where x represents any new symbol value for S(i), are any of the states 00, 10, 20, 30, 40, 50, 60 or 70, that is, any old state, the last digit of which (0) agrees with the first digit of the new state (also 0). Likewise, the candidate predecessor states for any new state 1x, are any of the states 01, 11, 21, 31, 41, 51, 61 or 71, i.e., any old state, the last digit of which (1) agrees with the first digit (1) of the new state. Similarly, the candidate predecessor states to new state 7x are the previous states the last digit of which was 7.

The possible transitions are shown by the arrows, groups of eight arrows from eight old states converging to each new state, although only four arrows of a few of the groups are shown for simplicity. The total trellis diagram for a 64-state machine would have 512 arrows. When comparator 108 of FIG. 3 selects a smallest metric, only one of the eight candidate transitions that converge to each new state is selected. If the arrow from old state 37 for example is selected to transition to new state 75 (for a new symbol S(i) hypothesis equal to 5) then the oldest symbol (3) from state 37 passes to path history memory 100.

Figure 6:
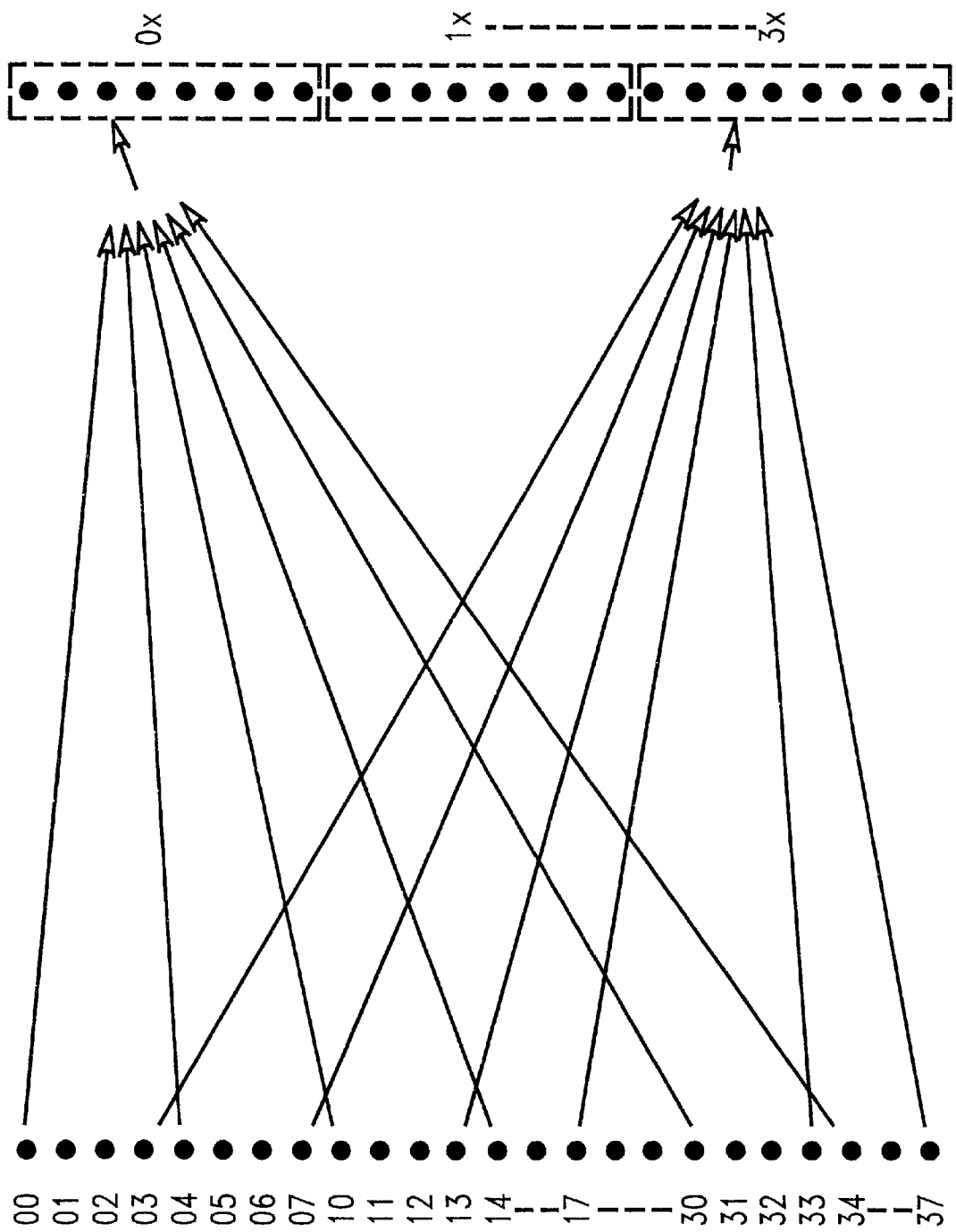
FIG. 6 illustrates the trellis diagram of the inventive decoder of FIG. 4.

FIG. 6 shows the trellis diagram for the inventive reduced complexity MSLE demodulator of FIG. 4. The trellis diagram has been simplified corresponding to simplifying the 64-state trellis of FIG. 5 to a 32-state trellis, by including only two out of the three bits of the oldest symbol in the state number, the third bit of the oldest symbol having been recorded in the path history memory 100 as illustrated in FIG. 4. Thus, the old states are numbered 00, 01, 02 . . . 07; 10, 11, 12 . . . 17; 20, 21, 22 . . . 27 and 30, 31, 32 . . . 37.

Now transitions can occur from any old state numbered ij, the last two bits of the last octal digit j of which agree with the two bits of the quaternary digit j' of new state j'x, where x is the hypothesis for new symbol S(i) and is an octal digit.

For example, transitions to new state 0k can occur from any of old states 00, 04, 10, 14, 20, 24, 30 or 34, as the last two bits of octal numbers 0 and 4 are the same (00). Likewise, transitions can occur from any of the old states 03, 07, 13, 17, 23, 27, 33, or 37 to a new state 3x as the last two bits 11 of octal numbers 3 and 7 are equal to quaternary 3.

Thus, while in FIGS. 3 and 5, a selection of a predecessor state was made from 8 states spaced 8 rows apart in the state memory, in FIGS. 4 and 6, the selection is made from 8 rows spaced four apart. When this selection is made in FIGS. 4 and 6, the third bit of the octal digit j of the old state together with the two bits of the digit i of the old state pass into the path history memory 100. The two bits of i combine with the single bit already in the path history memory 100 to complete a 3-bit value for S(i–3), which then shifts left into the position previously occupied by S(i–4); the third bit of digit "j" of the selected old state number passes in to the path history memory 100 to replace the single bit of S(i–3) previously stored there. This completes one cycle of this implementation of the inventive, reduced complexity MSLE machine that decodes parts of a symbol during each iteration.

In this implementation, part of a symbol (i.e., some bits of it), if it can be expressed in binary bits, are located in path history memory 100, being partially decided, while the other bits are still in the hypothesized state 101. Which parts of the symbol should pass from the hypothesized state 101 to the path history memory 100 first, for minimum performance loss, is a matter of conjecture which can be settled by computer simulation of both possibilities. One possibility is that it is best to make a tentative decision first on the cluster that the symbol is in, allowing the two bits "ab" of an 8-PSK symbol "abc" to pass to path history memory 100 while the bit "c" remains in the hypothesized state 101. The other possibility shown in FIG. 4 is to make a decision first on the "least significant" bit "c" allowing it to pass to path history memory 100, while leaving the bits "ab" that define the cluster "to be decided." An argument for the former is that the LSB "c" needs more chances to affect the cumulative metric in order to ensure a correct decision. An argument for the latter is that, if an error is made in taking a tentative decision, it is better that the error be in bit "c" rather than bits "ab" as the latter would impair future decisions more. The same arguments can be made for splitting 16QAM's 4-bit symbols in one way or another way. These uncertainties are best resolved by off-line simulation during the design process as the choice can depend on the actual constellations used and on the nature of the multipath channels of the case shown in FIG. 4.

If the alphabet size is other than a power of two so that a symbol is not obviously designated by a number of binary bits (for example, an alphabet size of 3×7=21 symbols), then the invention can describe the symbol by two digits, one ternary (3 values 0 . . . 2) and the other septal (7 values 0 . . . 6). The invention then allows one digit of a symbol, for example, the ternary digit to lie in path history memory 100 while the other, the septal digit, remains in hypothesized state 101. This corresponds to making a tentative decision as to which of three groups of seven symbols a symbol most likely belongs. For best performance, there is then an optimum way to group symbols into three groups of seven, rather than an arbitrary grouping.

Figure 8:
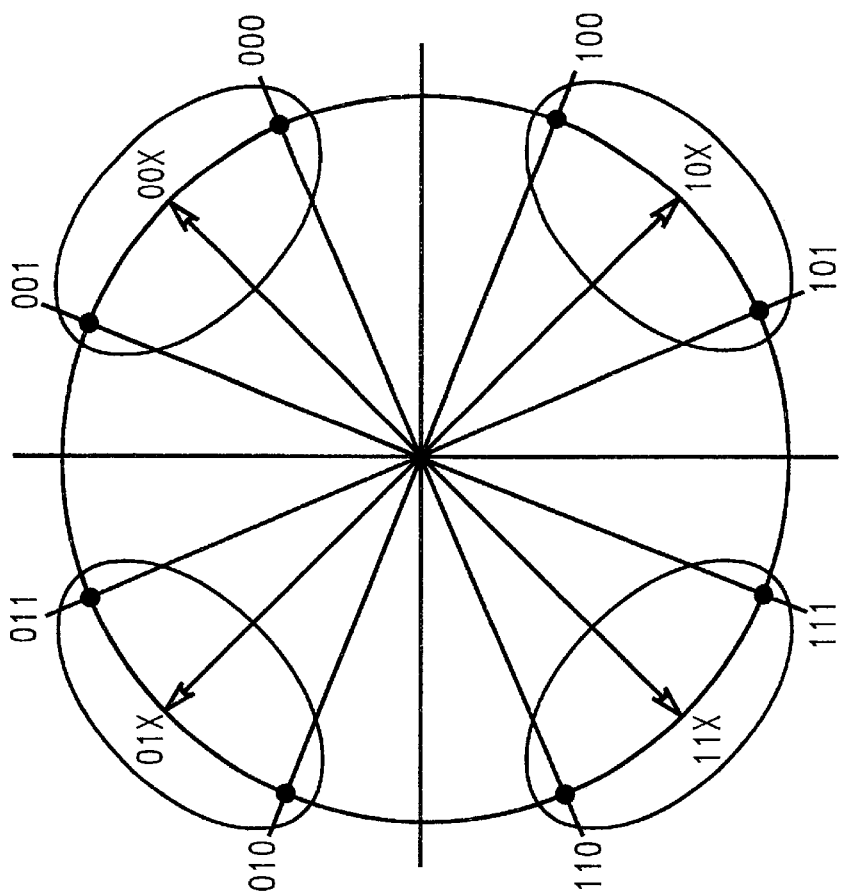
FIG. 8 illustrates how a signal vector can be approximately predicted using less than all bits of a multi-bit symbol in an 8-PSK example.
Figure 7:
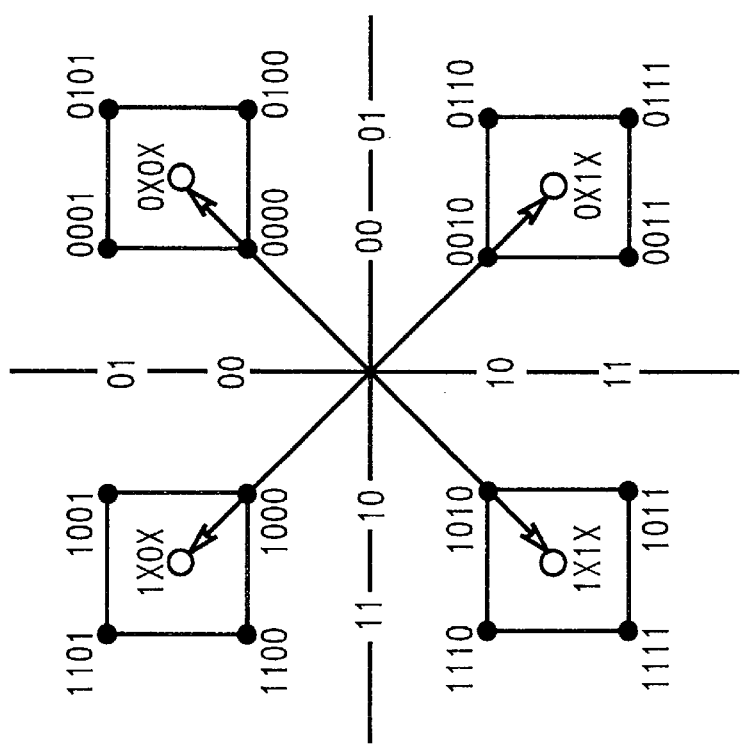
FIG. 7 illustrates how a signal vector can be approximately predicted using less than all bits of a multi-bit symbol in a 16QAM example.

This optimal grouping is illustrated for a hexadecimal system based on 16QAM modulation in FIG. 7 and an octal symbol system based on 8-PSK modulation in FIG. 8. First referring to the 16QAM diagram of FIG. 7, the complex plane contains a 4×4 grid of possible constellation points, each corresponding to a four-bit symbol. A point in the 4×4 16QAM constellation is defined by one of four values or levels 00, 01, 10, 11 of the real axis component x combined with one of four values 00, 01, 10 or 11 of the imaginary axis component Y. The assignment of bit-pairs to the four levels on each axis is deliberately chosen so that only one bit changes between adjacent levels, which are most easily confused by noise, while values differing in both bits are two levels apart. Thus, the most frequent type of error causes only one bit out of the bit-pair to be wrong while the two-bit error event occurs less with lower likelihood, thus minimizing bit error rate. This assignment of bit patterns to levels is called "Grey coding."

The 16 constellation points in FIG. 7 are grouped into four groups of four. The top left group of four comprises all points that have 1 as the first (leftmost) digit and 0 as the third digit, so can be designated as group If such a symbol is allowed to straddle the path history memory 100 and the hypothesized state 101 (FIG. 4) according to the invention, the first and third bits could be chosen, for example, as those which remain in the hypothesized state while the two bits marked x would pass to path history memory 100. Alternatively, the first and third bits could be chosen as those which pass to path history memory 100 while the "bxx" bits remain in the hypothesized state. The choice is not clear when, due to the DFE tap (which would select two bits from path history memory 100 in the case of a hexadecimal alphabet), all four bits of a symbol are still used in predictor 104 (FIG. 4).

However, if no DFE tap is used, and only the two bits of the symbol remaining hypothesized are used by predictor 104, there is an argument for the former choice as follows.

When the DFE tap is omitted, it is unclear which one of the four constellation points in a group is the correct one to use in prediction. Therefore, according to another aspect of the invention, the mean complex value of all four points should be used in predictor 104. This mean value is show by the arrows of FIG. 7 to the centers of the four squares designated by 0X0X, 0X1X, 1X0X and 1X1X. The theory is that, if an error has been made in tentatively deciding the values of bits xx that passes to path history memory 100, or if those bits are ignored by omitting the DFE tap, then using the mean vector (at the center of each square of FIG. 2) in prediction will result in only a small error as its distance from the correct one of the four points is minimum. Thus, when only 2 bits of a hexadecimal S(i−3) value are available, predictor (104) selects one of the four mean vectors to multiply with the channel coefficient C4. (If the "whole-symbol" DFE tap S(i−4) is also omitted, there is no channel coefficient C5).

A similar argument is made for assigning 3-bit values to the eight symbols of an octal system using 8-PSK modulation, as in FIG. 8. Three-bit patterns are assigned such that neighboring constellation points that are most easily confused differ only in one bit position, while symbols differing in two bit positions are two symbols apart and those differing in all 3-bit positions are three symbols apart. This is not perfect Grey coding, but is the best choice for 8-PSK. For 16-PSK, perfect Grey-coding is possible, in which symbols differing in all bits are diametrically opposite, i.e., as far apart as possible.

If now, as in FIG. 4, the symbol S(i−3) is allowed to straddle path history so that one bit lies in path history memory 100 and the other two are still in the hypothesized state 101, then FIG. 8 illustrates which two bits should remain hypothesized in the case that no DFE taps are used. Constellation points are grouped in neighboring pairs, as shown encompassed by the ellipses, such that two of the bits of each pair are the same. Then predictor 104, in absence of knowledge of the third bit, should utilize the mean complex vector of a pair illustrated by the arrow tips labeled 00X, 01X, 10X and 11X. This reduces the error compared to using the wrong value of the third bit. When this approximation is associated with a small value of channel coefficient C4 (as shown in FIG. 2), the loss of performance will be small.

The description of FIG. 4 above has illustrated one way to reduce complexity based on allowing a multi-bit symbol to straddle the region between path history and the hypothesized state. Another implementation of the invention is now described with the aid of FIG. 9 in which a multi-bit symbol straddles the new-symbol hypothesis 105 and the hypothesized state 100, i.e., the rightmost hypothesized symbol is now split rather than the leftmost hypothesized symbol. The performance compromise when using this method will be negligible when now channel coefficient C1 (FIG. 2) is small compared to the largest channel coefficient, as opposed to when C4 is small.

Figure 9:
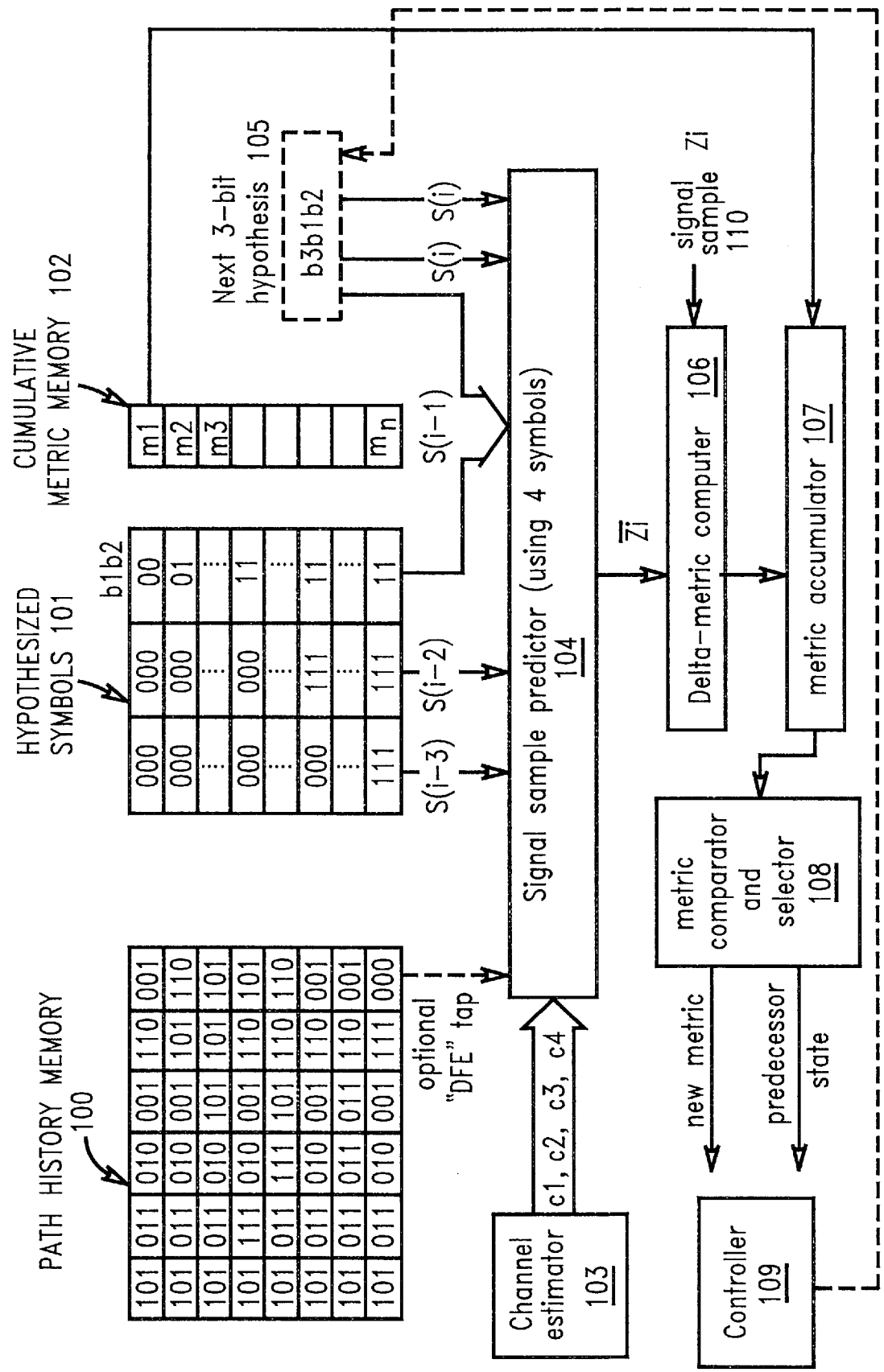
FIG. 9 illustrates a further exemplary embodiment of a decoder according to the invention.

In FIG. 9, the path history memory 100 contains whole, 3-bit octal symbols while the hypothesized state now contains a two-bit part "b1b2" of a symbol at the extreme right, corresponding to two out of three bits of symbol S(i−1). The next 3-bit hypothesis 105 now comprises the remaining or third bit b3 of S(i−1) together with the first two bits "b1b2" of next symbol S(i). Thus, when the contents of the hypothesis state 101 together with new 3-bit hypothesis 105 are applied to predictor 104, all three bits of symbol S(i−1) are available to determine the vector which should multiply large channel coefficient C2, while only the two bits "b1b2" are available for S(i). Consequently, in absence of bit "b3" of S(i), predictor should use one of the four mean complex values shown in FIG. 8 designated by 00X, 01X, 10X and 11X according to the two hypothesized bits "b1b2". "b1b2" are therefore the first (leftmost) two bits of the 8-PSK symbol and "b3" is the third bit marked "x".

The mean complex values are the best approximations to the true vector value that are available in the absence of a hypothesis for bit 3 of symbol S(i). The third bit cannot be hypothesized without doubling the number of states or rows in the state memory. Conversely expressed, the arrangement of FIG. 9 allows the complexity in terms of number of rows to be halved compared to the prior art of FIG. 3. Since the approximated mean vector values are weighted in predictor 104 with C1, the approximation error and consequent performance loss in this implementation will be small when C1 is small.

Figure 10:
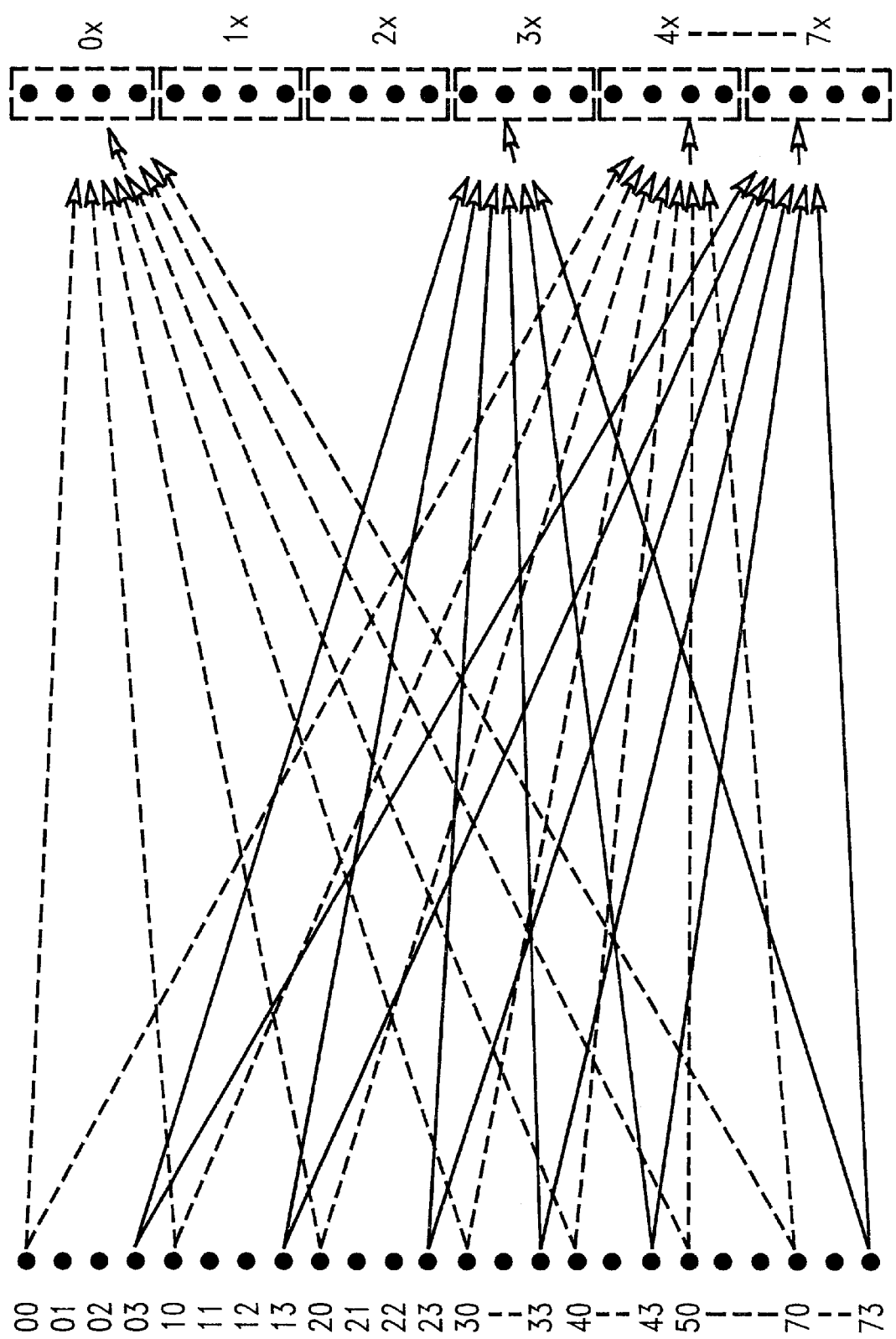
FIG. 10 illustrates the trellis diagram for the inventive decoder of FIG. 9.

The trellis diagram for FIG. 9 is shown in FIG. 10, and is different than the trellis of FIG. 6, even though the number of old and new states are the same. In the trellis of FIG. 10, a predecessor state that can transition to a successor state must have the right-most two bits of its index (corresponding to the partial or truncated symbol) in agreement with the rightmost two bits of the successor state's full or non-truncated symbol. That is, predecessor state number uvwxy (where uvwx and y are binary bits) can transition to successor state xyzab where z is either 0 or 1, i.e., to states xy0ab and xy1ab. The eight predecessor states with the same indices x and y and differing in uvw, thus transition to each of the new state-pairs xy0ab and xy1ab for each new-partial-symbol bit-pair ab. The newly hypothesized partial symbol ab, having no hypothesis for its third bit "c", shall, according to FIG. 8, be predicted to be one of the mean vectors indicated by 00X, 01X, 10X and 11X in FIG. 8, as the value "x" in FIG. 8, corresponding now to the un-hypothesized bit "c" is unknown.

If 16QAM modulation was employed, FIG. 7 shows how a 4-bit symbols wxyz or abcd can be partitioned into two 2-bit partial symbols wy and bd, which are jointly hypothesized as a new 4-bit hypothesis wbyd to complete a partial symbol .x.z that was hypothesized last time to obtain the complete symbol hypothesis wxyz. which forms part of a successor state index, .wxyzbd, to which a transition can occur from any predecessor state, stuvxz. Thus, the 16 states that agree in their xz index bits and differ in their index bits stuv of a state index, stuvxz, are the possible predecessors to new states, wxyzbd, for all four possible values of w and y, i.e., to new states 0x0ybd, 0x1ybd, 1x0ybd and 1x1ybd.

The shifting of bits through the different stages of the decoder according to the invention is shown in FIGS. 11 and 12. The three stages of decoding are:

Hypothesizing a new multi-bit pattern;

Labeling sequences tested according to the most recent symbol hypotheses; and

Storing the history of best preceding hypotheses in the "path history." The shifting of bits for an 8-PSK example is shown in FIG. 11 and a 16QAM example is shown in FIG. 12.

Different types of shift shown, in both examples are:

Shift of a complete symbol rst (8-PSK) or npqr (16QAM) from the hypothesis stage 101 to the path history memory 100;

Shift of a complete symbol rst (8-PSK) or npqr (16QAM) from the hypothesis stage 101 to the path history memory 100;

Shift of a complete symbol uvw (8-PSK) or stuv (16QAM) one place to the left within the hypothesized state (101);

Combination of a partial symbol xy (8-PSK) or wy (16QAM) already in the hypothesized state 101 with the rest of the partial symbol z (8-PSK) or xz (16QAM) from the newly hypothesized bits 105 to form a complete 8-PSK symbol xyz or 16QAM symbol wxyz which is shifted left one place in the hypothesized state 101; and Shifting the partial symbol ab from the new hypothesis stage 105 to the hypothesized state 101.

The main purpose of FIGS. 11 and 12 is to clarify the method of splitting a symbol into a first partial symbol comprising digits that define a cluster of neighboring constellation points as shown in FIGS. 7 and 8 and a second partial symbol comprising the remaining digits that define a unique symbol within that cluster. When symbols were split between hypothesized state 101 and path history memory 100 as in FIG. 4, it was a matter of conjecture, to be settled by computer simulation as discussed above, whether one or other part of the symbol should be located in one or other state. However, in the case of FIG. 9, it seems clear, when a partial symbol is hypothesized as part of new multi-bit hypothesis 105, that it should be the partial symbol bits defining the cluster (i.e., the leftmost two bits of the 8-PSK symbols as shown in FIG. 8, or the first and third bits counting from the left, for 16QAM as shown in FIG. 7) which should be hypothesized, as these affect predictor 104 and thus the metric values by the greatest amount. Nevertheless, it is recommended that in general, different ways of splitting the symbol by partitioning the constellation into clusters should be tested by computer simulation and that partitioning which gives the lowest symbol or bit error rate should be selected.

It is possible to split symbols at both ends of the state index, that is to combine the methods both of FIG. 4, where symbol S(i−3) is split, and of FIG. 9, where S(i−1) is split, to achieve a reduction in the number of states by a factor of four in the case of 8-PSK or 16 in the case of 16QAM without reducing the number of symbols used for prediction in 104. This gives only a small penalty in performance if the first and last channel coefficients (e.g., C1 and C4) are small. Using the above teachings, a person skilled in the art will be able to derive the trellis diagrams corresponding to FIGS. 6 and 10 and the corresponding bit-shifting similar to FIG. 11 for this variation of the invention using 8-PSK, 16QAM or higher order modulations.

The invention does not restrict symbol splitting to the first and last symbol used in prediction either, but can be extended to include splitting each of a group of symbols located either at the end or at the beginning (or both) of the hypothesized state 101, those at the end being split between the hypothesized state 101 and the path history memory 100, and those at the beginning of the hypothesized state 101 being split between the hypothesized state 101 and a new multi-bit hypothesis. Furthermore, the invention permits the choice of split-symbol location to be dynamically varied in dependence on whether the first or the last of the channel coefficients is smaller than the others, so that the performance loss due to the reduction in state space is always minimized. This dynamic change to the structure of the state space and trellis diagrams between the versions shown by FIGS. 4 and 6 on the one hand and 9 and 10 on the other hand may be made in dependence on the channel coefficient estimates made by channel estimator 103. Channel estimator 103 may update the channel estimates by correlation once per received signal sample block, such as a block corresponding to a TDMA signal burst or timeslot, burst-wise channel tracking) or alternatively after processing each new signal sample (fast or symbol-wise channel tracking), both of which are known and described in the incorporated art, and a test can be performed after channel updating to determine if C1 or C4 (FIG. 2) is the smaller.

For situations in which neither C1 nor C4 is small, the received signal sample stream can optionally be subjected to a linear prefiltering operation to change the composite channel through which the signal has propagated in order to ensure than particular channel coefficients are smaller than others, thus reducing the performance loss when reducing the state space by symbol splitting according to the invention. The prefiltering operation can include decimating a signal sampled at more than one sample per symbol to select a particular sample per symbol for processing according as the channel estimates computed from the decimated have the property that either the first or last channel coefficient or both are small. Prefiltering can also include the use of FIR filters or IIR filters or any combination of FIR or IIR filters operating on one or more signal samples per symbol period together with decimation. A so-called fractionally-spaced equalizer may also be constructed employing the invention, in which more than one signal sample per symbol is predicted by predictor 104 using different channel estimates for different signal samples in the same symbol period. The arrangement of FIG. 4 using the trellis of FIG. 6 can then be applied when processing one of the signal samples, alternating with the arrangement of FIG. 9 using the trellis of FIG. 10 when processing another of the signal samples. Additionally, this invention may be practiced in software, hardware or some combination thereof. All of these variations, when involving splitting of multi-digit symbol indices between different states of hypothesis or decision within an MLSE decoder are considered to fall within the scope of this invention as described by the following claims.

I claim:

1. A method for processing samples of a signal that has propagated from a transmitter to a receiver via multiple propagation paths in order to decode information symbols belonging to an alphabet of symbols, said method comprising the steps of:
hypothesizing symbol sequences comprising symbols from said alphabet of symbols and partial symbols, said partial symbols identifying sub-groups of symbols within said alphabet;
predicting an expected value of said signal samples for each of said hypothesized symbol sequences;
comparing the actual values of said signal samples with said predicted values in order to determine a likelihood value for each of said hypothesized symbol sequences;
storing hypothesized symbol sequences, including whole symbols and partial symbols in association with said likelihood values; and
selecting a hypothesized symbol sequence having the greatest of the determined likelihood values to be said decoded information symbols, wherein each of the decoded symbols belongs to one of said sub-groups of symbols identified by said hypothesized partial symbols.

2. The method of claim 1 in which said signal samples are complex numbers.

3. The method of claim 1 in which said sub-groups of symbols are each selected to contain symbols represented by clusters of adjacent values of said signal samples.

4. The method of claim 1 in which said prediction of a signal sample combines selected signal values associated with each of the symbols in said alphabet with estimates of the propagation value for corresponding ones of said multiple propagation paths, said selected signal values corresponding to hypothesized symbols or partial symbols.

5. The method of claim 4 in which a signal value selected for a partial symbol is the average signal value over all symbols in the alphabetic subgroup indicated by the partial symbol.

6. The method of claim 4 in which the locations of said partial symbols in said hypothesized sequences are chosen such that partial symbols are combined with propagation values having relatively small estimates while other symbols are combined with propagation values with relatively large estimates.

7. The method of claim 1 in which said hypothesized symbol sequences are successively extended by one additional symbol using maximum likelihood sequence estimation.

8. The method of claim 1 in which said hypothesized symbol sequences are successively extended by one partial symbol using maximum likelihood sequence estimation.

9. The method of claim 8 further including determining likelihood values for sequences containing all possible values for a symbol in the alphabetic subgroup indicated by the previously hypothesized partial symbol.

10. A decoder for decoding a signal modulated with information symbols belonging to an alphabet of symbols, comprising:
maximum likelihood sequence estimation means to hypothesize alphabetic subgroups containing said information symbols, to hypothesize symbols within said alphabet, and to determine a sequence of said information symbols having a highest likelihood indication;
channel estimation means to estimate coefficients describing a channel through which said signal has propagated;
signal prediction means to combine said channel estimates with said hypothesized symbols and alphabetic subgroups to obtain a signal prediction;
comparison means for comparing said signal predictions with corresponding samples of said signal to obtain a metric; and
metric accumulation means to accumulate said metrics for hypothesized symbol sequences to determine said likelihood indications.

11. The decoder of claim 10 in which symbols within the same one of said alphabetic subgroups are encoded into adjacent signal values within the signal space.

12. The decoder of claim 11 in which said signal space is the complex plane representing amplitude of a cosine wave signal component combined with amplitude of a sine wave signal component.

13. The decoder of claim 10 in which said prediction means combines one of said channel estimates with one of said alphabetic subgroups by multiplying a channel estimate with an average expected signal value for the alphabetic subgroup.

14. An adaptive decoder for processing a signal received through multi-path propagation to decode information symbols belonging to an alphabet of symbols, comprising:
means for converting symbols to signal values;
means for representing alphabetic subgroups of symbols by an average of said signal values for symbols within the same alphabetic subgroup;
channel estimation means for estimating propagation constants for each of said multiple propagation paths; and
adaptive maximum likelihood estimation means for hypothesizing and storing sequences containing a predetermined number of symbols or of said alphabetic subgroups, said sequences either beginning with an alphabetic subgroup or alternatively ending with an alphabetic subgroup in dependence on said estimated propagation constants.

15. A decoder of reduced complexity for decoding a received signal to reproduce multi-bit information symbols, comprising:
maximum likelihood sequence estimation means for hypothesizing sequences of multi-bit groups containing a first number of bits representing said multi-bit symbols and multi-bit groups containing a second number of bits less than said first number of bits representing subgroups of said multibit symbols and for selecting and storing sequences of symbols and subgroups having associated likelihood-related values indicative of highest likelihood;
channel estimation means for estimating channel coefficients describing the dependence of said received signal on said multi-bit symbols at different positions in said hypothesized sequences;
prediction means for predicting expected signal values corresponding to said hypothesized sequences by combining groups of said first number of bits with a first set of said channel coefficients and groups of said second numbers of bits with a second set of said channel coefficients; and
metric accumulation means for accumulating the results of comparisons between said predicted expected signal values and corresponding values of said received signal in order to produce said likelihood-related values.

* * * * *